United States Patent [19]

Asher

[11] Patent Number: 5,327,160
[45] Date of Patent: Jul. 5, 1994

[54] TOUCH SENSITIVE USER INTERFACE FOR TELEVISION CONTROL

[76] Inventor: David J. Asher, P.O. Box 8748, Albany, N.Y. 12208

[21] Appl. No.: 978,148

[22] Filed: Nov. 16, 1992

Related U.S. Application Data

[63] Continuation of Ser. No. 698,498, May 9, 1991, abandoned.

[51] Int. Cl.5 .............................................. G09G 3/02
[52] U.S. Cl. ................................... 345/156; 345/173; 348/553
[58] Field of Search ........... 340/706, 709, 712, 825.69, 340/825.72, 753, 722; 341/23; 455/603, 612; 358/194.1, 22, 192.1; 345/156, 157, 173, 140

[56] References Cited

U.S. PATENT DOCUMENTS

| | | |
|---|---|---|
| 4,293,734 | 10/1981 | Pepper, Jr. ............................ 178/18 |
| 4,340,908 | 7/1982 | Wakabayashi et al. ........... 358/194.1 |
| 4,386,436 | 5/1983 | Kocher et al. ..................... 358/194.1 |
| 4,389,731 | 6/1983 | Wu ...................................... 358/194.1 |
| 4,631,525 | 12/1986 | Serravalle, Jr. ........................ 340/712 |
| 4,745,402 | 5/1988 | Auerbach ............................ 340/709 |
| 4,746,919 | 5/1988 | Reitmeier ........................ 358/194.1 |
| 4,825,200 | 4/1989 | Evans et al. ............................ 341/23 |
| 4,907,082 | 3/1990 | Richards ............................. 358/143 |
| 4,959,721 | 9/1990 | Micic et al. ..................... 358/194.1 |
| 4,965,557 | 10/1990 | Schopers et al. .................... 340/711 |
| 5,008,497 | 10/1991 | Asher ................................... 178/18 |

FOREIGN PATENT DOCUMENTS 0139762 11/1984 United Kingdom ................ 340/712

OTHER PUBLICATIONS

Applications Note AN1311, Signetics, 1987.
Applications Note AP-62, Intel, 1985.
Data sheet MC1378, Motorola, 1987.
Data sheet NE5044, Signetics, 1987.
Data sheet NE5045, Signetics, 1987.
Data sheet LM1871 National Semiconductor, 1982.
Data sheet LM1872, National Semiconductor, 1982.
Data sheet MC145026, Motorola, 1986.
Data sheet MC14457, Motorola, 1986.
Data sheet ADC0804, Texas. Instruments, 1989.
Data sheet NE5037, Signetics, 1987.
Data sheet MM58250, National Semiconductor, 1984.
Data sheet MC14497, Motorola, 1986.
Data sheet MC3373, Motorola, 1987.
"I Can't Work This Thing", Bruce Nassbaum and Robert Neff, *Business Week*, Apr. 29, 1991, pp. 58-66.
A Way to Ease Remote Control Panic, John Gosch, *Electronics*, Apr. 1989, pp. 39-40.

Primary Examiner—Alvin E. Oberley
Assistant Examiner—Chanh Nguyen

[57] ABSTRACT

A remote control system for control of an external device from a remote location is disclosed that comprises a remote controller 11 and a receive and display unit 16. The remote controller employs a touch fader 10, which the user touches to activate a visual feedback system 14, such as menus and bargraphs, in the receive and display unit. Changing the position of the touchpoint will change the selection, allowing the user to easily scroll through many selections or a hierarchy of menus. Releasing the touch fader will signal the user's acceptance of a selection. Commands are sent to control the external device according to the user selections which follow from a predefined command structure.

2 Claims, 9 Drawing Sheets

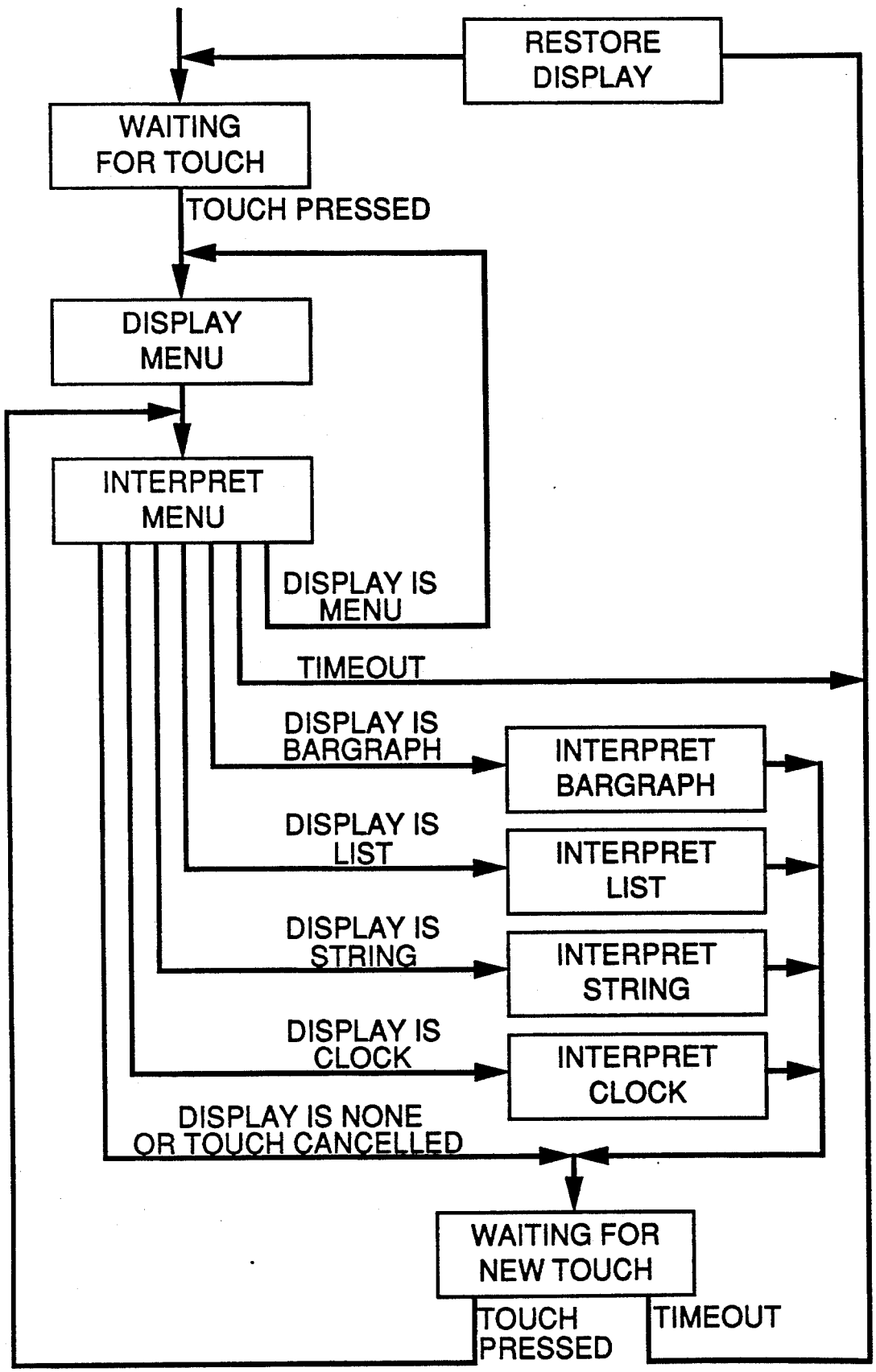
FIGURE 4 - COMMAND INTERPRETER

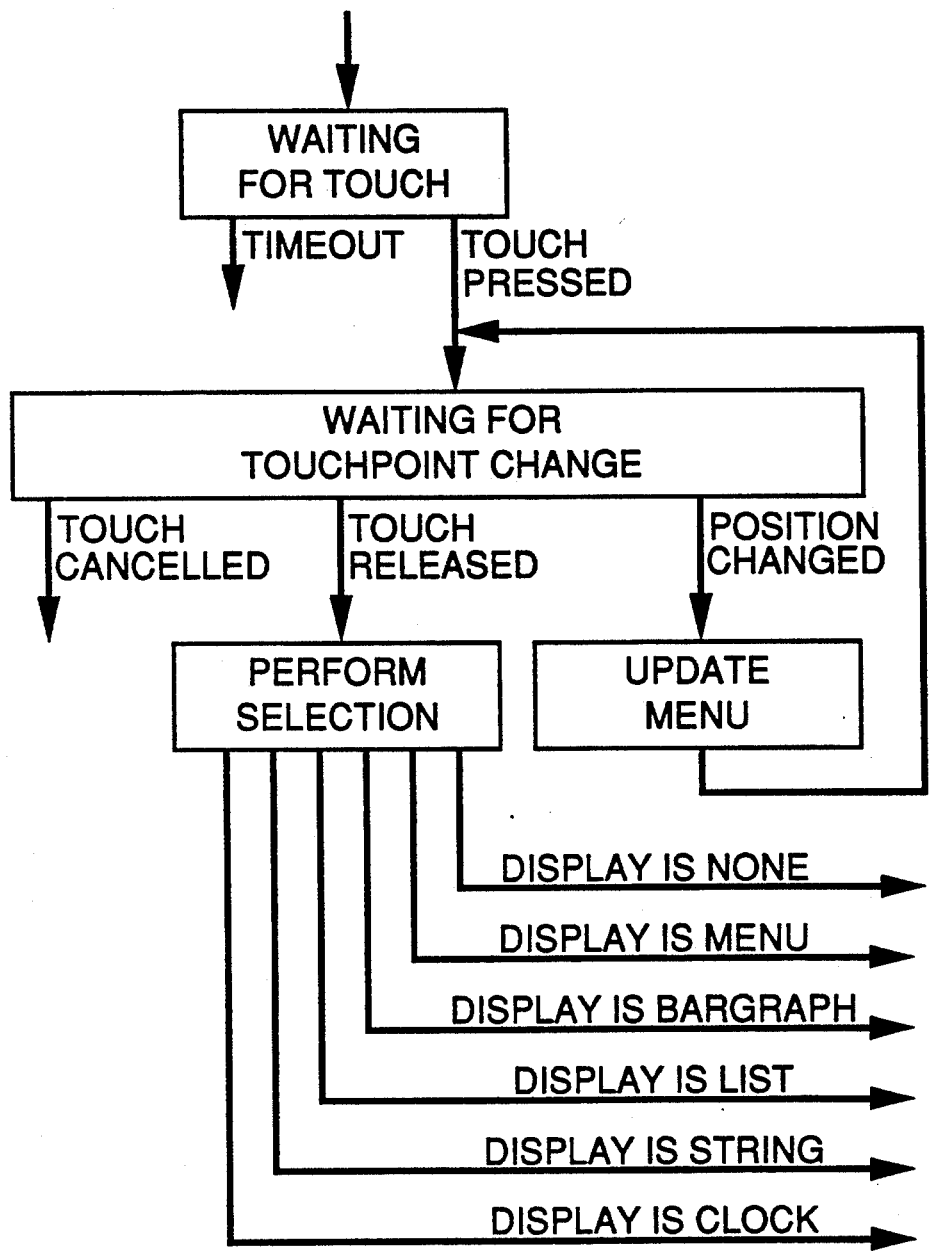
FIGURE 5 - INTERPRET MENU

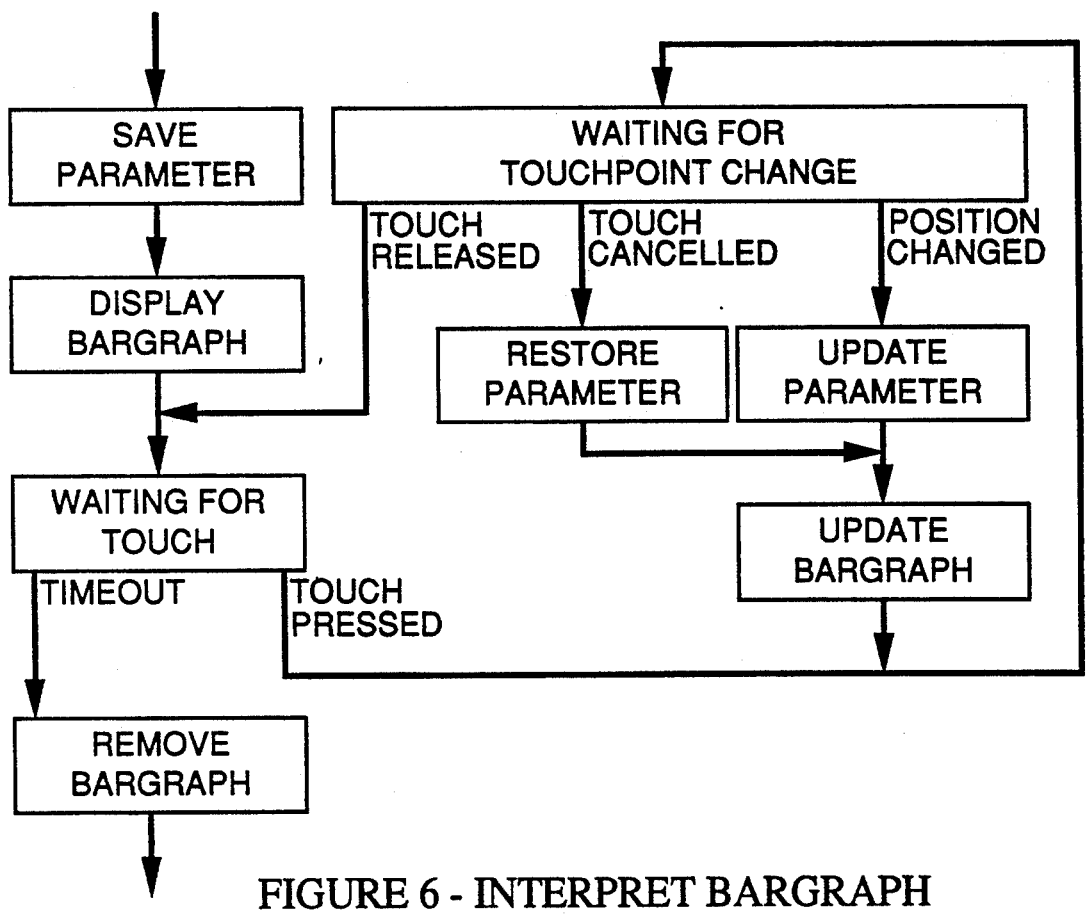
FIGURE 6 - INTERPRET BARGRAPH

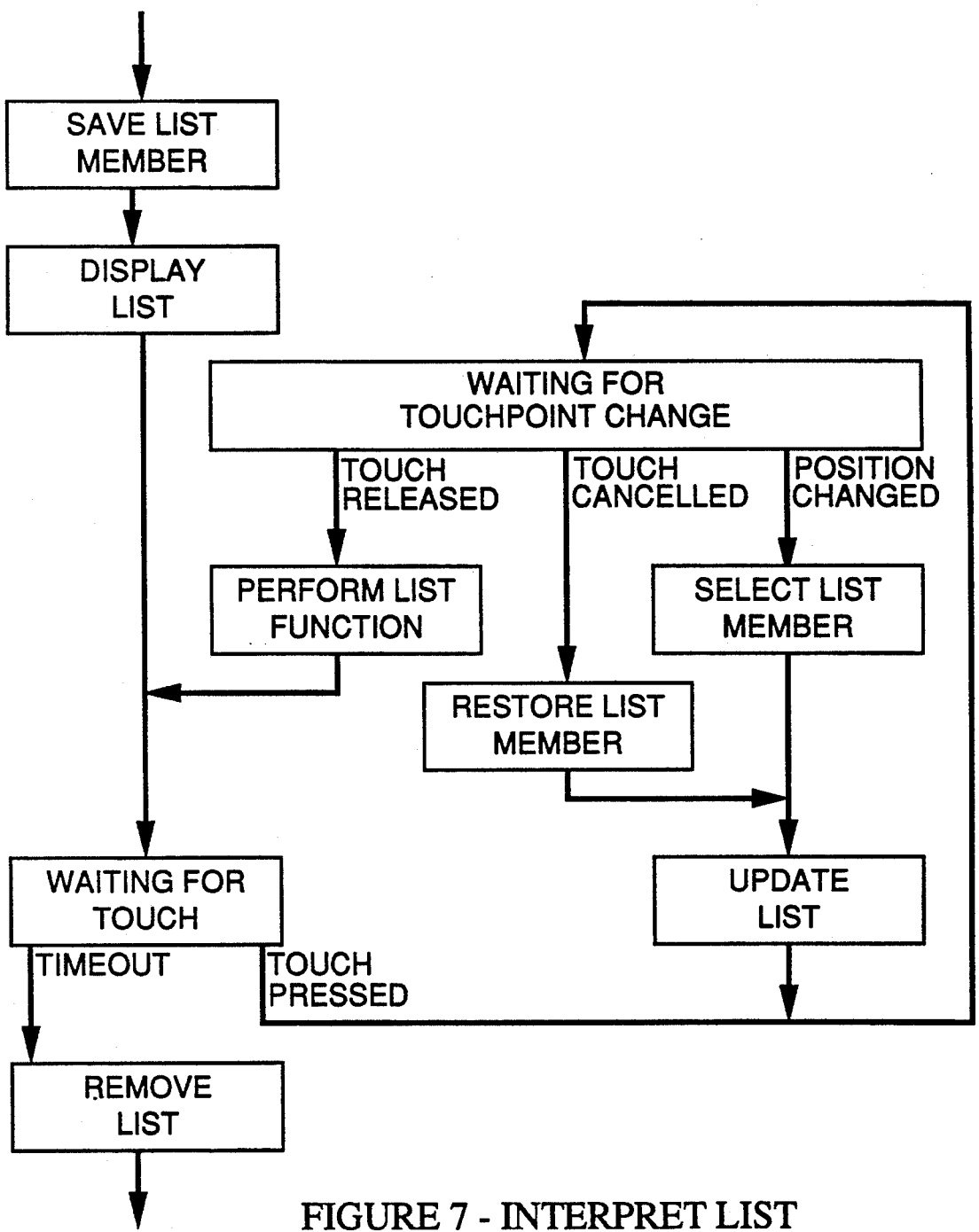
FIGURE 7 - INTERPRET LIST

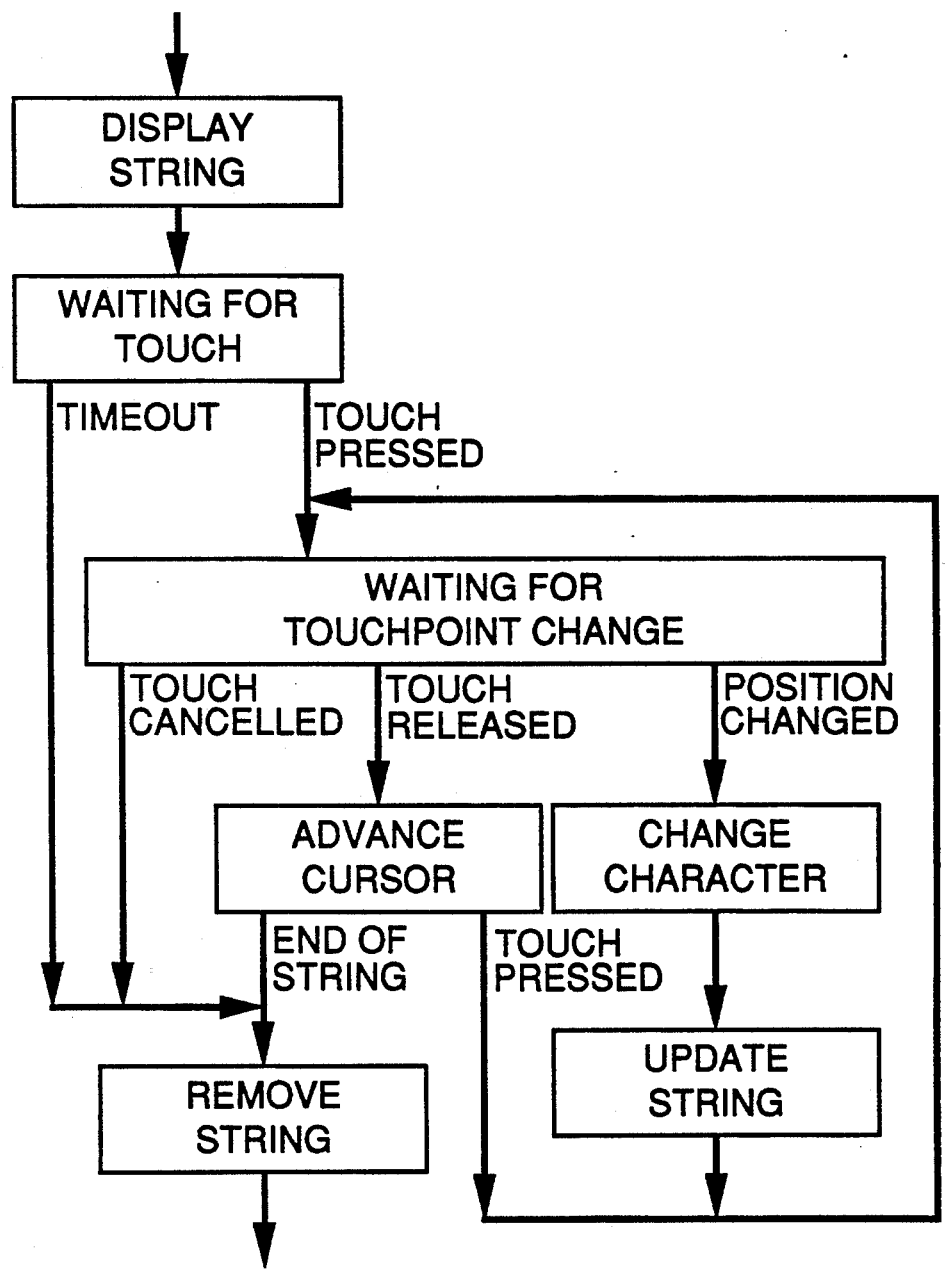
FIGURE 8 - INTERPRET STRING

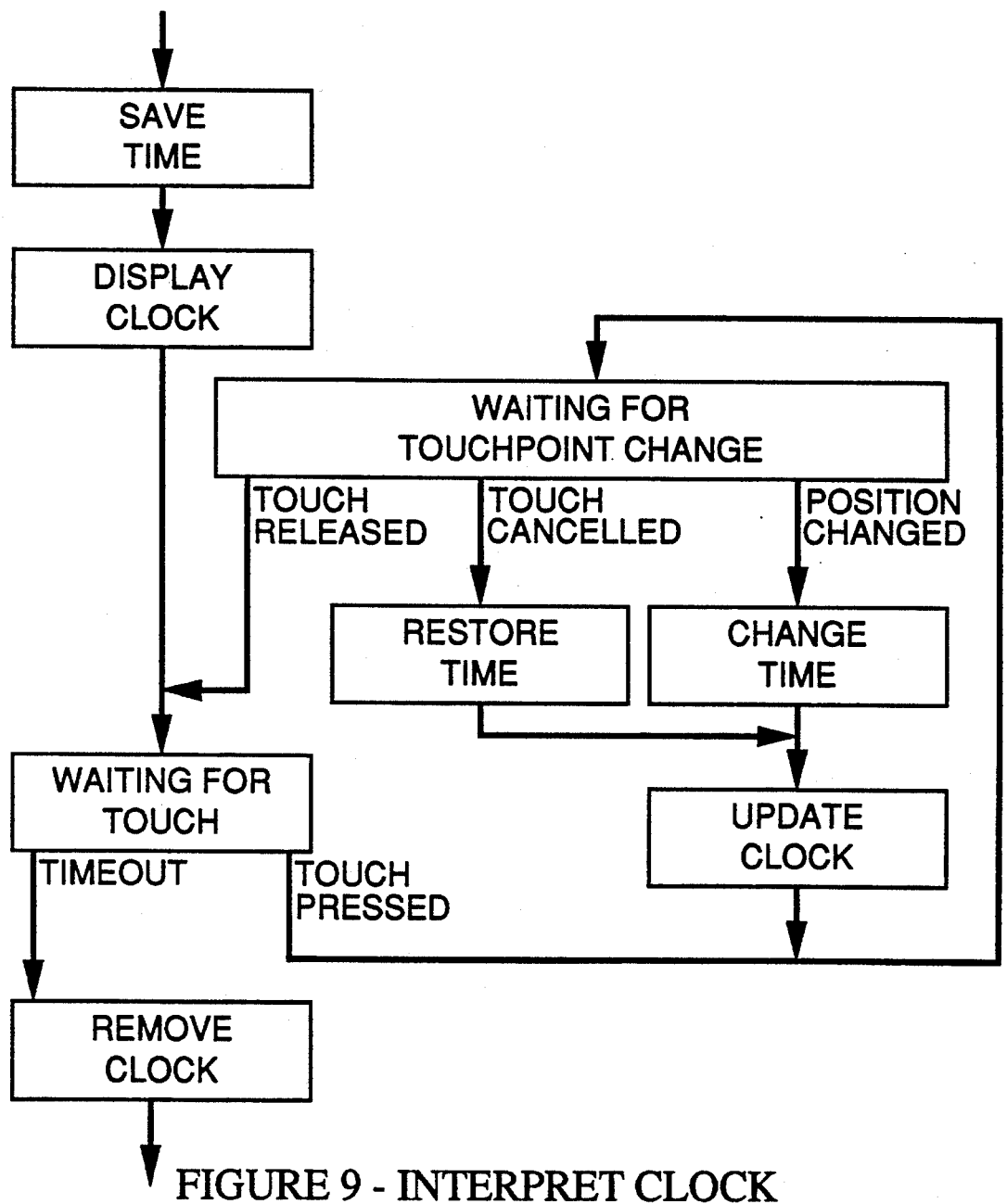
FIGURE 9 - INTERPRET CLOCK

TOUCH SENSITIVE USER INTERFACE FOR TELEVISION CONTROL

This is a continuation of application Ser. No. 07/698,498, filed May 9, 1991, now abandoned.

FIELD OF THE INVENTION

This invention relates to systems for providing remote control over a device, such as a television (TV), video cassette recorder (VCR), or computer. The remote control system comprises a remote controller that uses touch-sensitive input and a receive and display unit that provides visual feedback to the user.

BACKGROUND OF THE INVENTION

The many complex functions of present-day consumer electronics often confuse the user to the point where the functions can't be understood and utilized by the user. "I Can't Work This Thing!", *Business Week*, Apr. 29, 1991, describes this consumer frustration and the resulting trend in product design to simplify the user interface.

In particular, remote controllers have proliferated and are often provided as standard accessories to many consumer electronics devices, such as TVs and VCRs. The typical consumer may have several remote controllers, each remote controller having an array of up to 50 buttons that make it difficult to perform the simplest functions such as lowering the volume when the phone rings. Forget about setting the clock!

A principle drawback is that the user must look at the remote controller in order to operate it, which is a distraction since the user is typically looking at the visual display. These remote controllers also require sufficient lighting in order to read the legends on the buttons, which often conflicts with the desire to watch television in a dimly lit room. As the number of buttons increases, simply finding the right button—and not making a mistake—is a chore.

Evans et al, U.S. Pat. No. 4,825,200, describe a remote control transmitter that can "learn" the codes transmitted by other remote controllers, which addresses the problem of a user having to contend with too many controllers. However, this method increases the complexity of the device, exacerbating the problem of a confusing user interface.

Micic et al, U.S. Pat. No. 4,959,721, describe a remote control system that uses a menu system within the television. However, this system uses key switches which are cumbersome to use when trying to change a continuous control, such as volume or channel selection. Schopers et al, U.S. Pat. No. 4,965,557, describe a similar visual-feedback remote control system that can be used to control several devices from a single remote controller. However, this device also uses multiple key switches.

"A Way To Ease Remote Control Panic", *Electronics*, April 1989, describes a simple remote control system that addresses the problems of remote controller proliferation and user interface complexity. This pointing remote controller has an infrared transmitter and a single button, and the TV has a special receiver that detects the direction that the remote controller is pointing. The user simply points the remote controller to an area on the screen, and is able to perform menu selections and set continuous controls, such as volume, by changing direction and pressing the button. The need for many confusing buttons is eliminated, and the user's attention remains fixed to the visual display, rather than on the remote controller.

This device has a major advantage in that the data sent by the remote controller has no semantic value: a typical remote controller button must be labelled "CHANNEL UP", for example, and the TV must correctly interpret the code sent by the remote controller as a "CHANNEL UP" command. The pointing remote controller, on the other hand, does not require any change in the remote controller to perform many diverse functions on different devices. The semantic value of the user's commands are interpreted entirely within the receiving system based on the current display presented to the user, thereby standardizing the remote controller and increasing its flexibility.

The pointing remote controller has two significant faults, however. The receiving sensors and circuitry required in the TV or VCR are special, they are different than the hardware that is currently used, and more complex. This makes it difficult for a manufacturer to incorporate into a product line since it requires significant changes in the product design and is unfamiliar to the designers. Secondly, the user might not always be directly facing the video screen or in an upright position, such as lying down on a couch, in which case pointing the remote controller in the proper direction becomes a confusing and disorienting operation.

OBJECTS AND ADVANTAGES OF THE INVENTION

The principle object of the present invention is to provide a remote control system that is simple, intuitive, and convenient for the user to control a complex device, such as a TV, VCR, or computer.

The second object of the present invention is to provide a remote control system whereby the remote controller can be standardized such that only a single remote controller is necessary to control a variety of devices.

The third object of the present invention is to provide a remote control system that is attractive for a manufacturer to implement, both in existing products and in new product designs.

Whereas most remote controllers employ an array of on/off buttons which are labelled to perform dedicated functions, the present invention employs only a single touch fader, which detects the presence and position of the user's finger. To use the remote control system, the user simply touches the touch fader, slides his or her finger along the touch fader, and then releases. A receive and display unit provides visual feedback in the form of a symbolic representation of some parameter to be changed.

One example of a symbolic representation is a menu of selections, such as "VOLUME, CHANNEL, CLOCK SET . . . ". The user moves his or her finger along the touch fader while observing highlighted changes in the menu. Releasing the touch fader with the desired menu item highlighted selects that menu item. For example, selecting "VOLUME" would then display a volume bargraph which visually indicates the current volume set. Again touching the touch fader and moving his or her finger, the user would bring the volume to a new level corresponding to the touch position, both seeing the new volume visually on the bargraph, and hearing the corresponding change in volume. Releasing the touch fader accepts that volume change and removes the symbolic representations from the visual display.

As can be seen from this example, the present invention does not require the user to look away from the visual display. Further, the remote controller can easily be used in a darkened room, and there is no requirement to orient the remote controller, so the user need not perform a "conceptual mapping" from the orientation of the remote controller to the visual display.

The full semantic meaning of the user's action is determined within the receiving and display unit, typically by software executing on an embedded microprocessor. Therefore, a single remote controller can be used to control a wide variety of devices, with the embedded software interpreting the appropriate controls over each device. Further, any learning that need be performed by the user is limited to a single, intuitive, and consistent action: rubbing the touch fader.

The present invention may employ any of the typical communications methods used by the many existing remote controllers: infrared, ultrasonic, radio, or wired. In many cases, a manufacturer is not only familiar with these technologies, but already has the symbol generating capability within the products. In order to implement the remote control system of the present invention, all that need be changed within the receive and display unit is software. Further, the elimination of mechanical buttons and the minimal electronic circuitry required to manufacture the remote controller enables the present invention to be cost competitive with existing remote controllers.

SUMMARY OF THE INVENTION

The present invention is a remote control system for providing a simple user interface that enables the control of an external device, such as a TV, VCR, or computer, from a remote location. The remote control system has two main components, a remote controller and a receive and display unit.

The remote controller is typically a hand-held unit, and comprises a touch fader for sensing the presence and position of a user's touchpoint, a touch fader reader for detecting the presence and measuring the position of the user's touchpoint, a transmitter for converting the presence and position of the user's touchpoint into a transmission signal, and a transmit transducer for transmitting the transmission signal across a communications channel.

The receive and display unit is typically housed in a stationary console, and comprises a receive transducer for receiving the transmission signal from the communications channel, a receiver for recovering the presence and position of the user's touchpoint from the transmission signal, a command interpreter for interpreting the presence and position of the user's touchpoint as an intended command based on previous intended commands and based on a predefined command structure and for commanding changes to the external device, a symbol generator for generating a symbolic representation of the intended command, and a visual display for displaying to the user the symbolic representation of the intended command.

Various transmit transducers may be chosen depending on the communications channel desired, including a radio wave transmit antenna, a light source, a sound generator, or an electronic wire transmitter. The receive transducer may similarly be chosen to be a radio wave receive antenna, a light detector, a microphone, or an electronic wire receiver.

In some cases it is preferable for the remote control system to merge an external video signal with the symbolic representation of the intended command, so that the symbolic representation may overlay a background image. In one instance, the visual display is a television and the external video signal is the televised signal. In another instance, the visual display is a computer monitor and the external video signal is the computer-generated video.

There may be several preferable symbolic representations, depending on the external device to be controlled and the nature of the particular parameter to be changed. These symbolic representations include a menu, a bargraph, a list, a string, and a clock. In each case, the value indicated by the symbolic representation is determined by the position of the user's touchpoint.

Versatility can be added to the user interface by employing a touch fader that senses the pressure of the user's touchpoint as well as position.

To allow for user errors, it may sometimes be necessary for a user to cancel the current input operation. Designating a portion of the touch fader, preferably the bottom, as a cancel zone allows the user to slide into the cancel zone, thereby cancelling the current operation before releasing the touch fader.

BRIEF DESCRIPTION OF THE DRAWINGS

FIG. 4 shows the state transition diagram for a command interpreter.

FIG. 5 shows the state transition diagram for an interpret menu process.

FIG. 6 shows the state transition diagram for an interpret bargraph process.

FIG. 7 shows the state transition diagram for an interpret list process.

FIG. 8 shows the state transition diagram for an interpret string process.

FIG. 9 shows the state transition diagram for an interpret clock process.

DETAILED DESCRIPTION OF THE INVENTION

Figure 1:
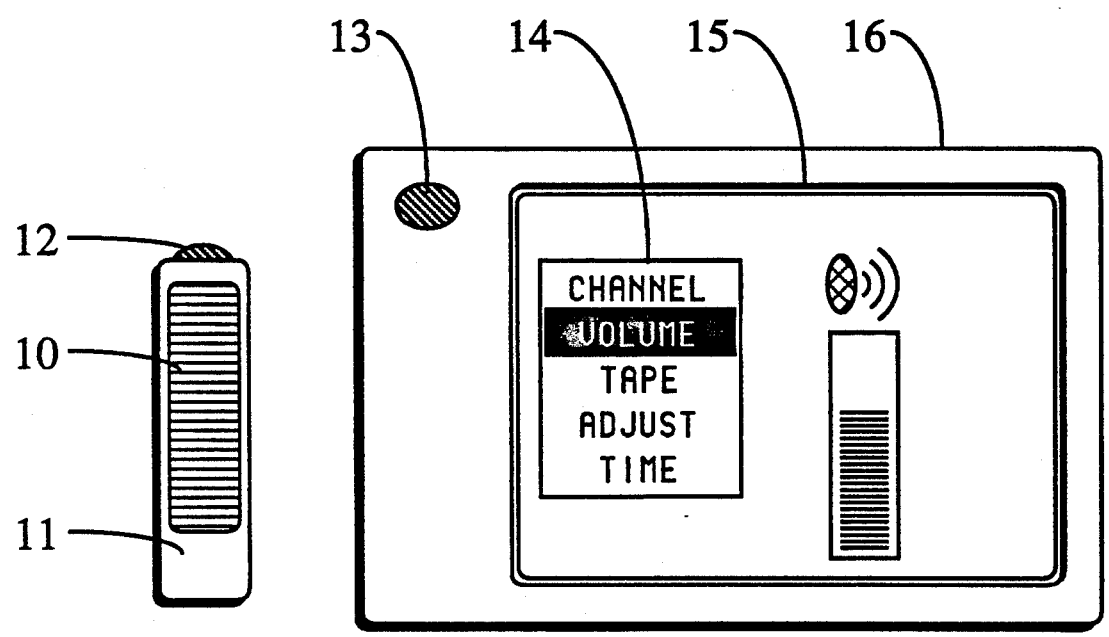
FIG. 1 shows the major components of the remote control system, as seen by the user, including a remote controller 11 and a receive and display unit 16.

FIG. 1 shows an overview of the remote control system. The two principle components are a remote controller 11, and a receive and display unit 16.

Typically, the remote controller 11 is a portable hand-held unit with a plastic molded housing, but other materials can be used. The remote controller may also be desktop unit or may be incorporated into some other device.

The only necessary user control on the remote controller is a touch fader 10, which senses the presence and position of a user's finger, but other buttons could be included if desired. A transmit transducer 12 transmits the touchpoint information to the receive and display unit 16, where it is detected by the receive transducer 13.

The receive and display unit 16 incorporates a visual display 15 that presents the user with a symbolic representation 14 which guides the user in operating the external device to be controlled. The receive and display unit 16 might include a television or computer monitor as the visual display. The entire receive and display unit might be integral to a television or computer, or it may be an external component.

Figure 2:
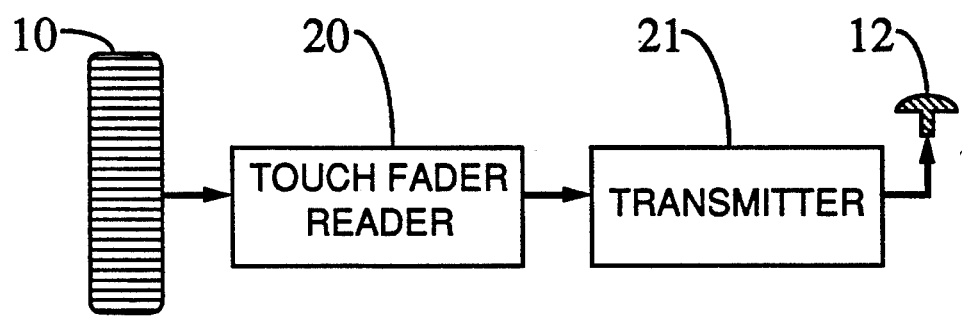
FIG. 2 shows the internal structure of the remote controller 11.

FIG. 2 shows the internal structure of the remote controller 11. The touch fader 10 senses the presence and position of a user's finger. The touch fader reader 20 interfaces to the touch fader 10 and provides electrical signals indicating the presence and position of the touchpoint. The transmitter 21 accepts the touchpoint presence and position information and converts it to a transmission signal that may be transmitted over the communications channel via the transmit transducer 12.

The touchpoint position is a variable signal that indicates the position of the user's finger along the touch fader. The touchpoint presence is a binary signal that indicates whether a finger is touching, and therefore whether the position is valid.

A typical touch fader can be made from a resistive membrane deposited on a plastic substrate. Such a touch fader is described in the data sheet for the SoftPot Membrane Potentiometer, by Spectra Symbol, Salt Lake City, Utah, which is hereby incorporated by reference. A touch fader may also be made using capacitive touch technology, as described in Pepper, Jr., U.S. Pat. No. 4,293,734, which is hereby incorporated by reference. Asher, U.S. Pat. No. 5,008,497, which is hereby incorporated by reference, describes a touch fader that provides the pressure of the touchpoint as well as the position. These references also describe electronic circuits that may be used to implement the touch fader reader 20.

In general, it is not necessary to mark the touch fader with any legends, although such marking could improve the user interface. For example, printing "Touch Here" with up and down arrows will make the use of the remote controller clear to a first-time user. Also, it would be helpful to designate a zone at one end of the touch fader and label it "Cancel" or "Oops!". Sliding a finger into this cancel zone would enable the user to cancel any pending operation. This could be important if the user makes a mistake and finds himself touching the touch fader, not wanting to release it for fear of changing something that wasn't intended.

Several methods of communications from the remote controller 11 to the receive and display unit 16 may be employed by the present invention, including: radio wave (including amplitude modulated and frequency modulated); sound (including ultrasonic); optical (including infrared and fiber optic); and wired (including AC household wiring).

Several integrated circuits are available to implement the transmitter, such as the National Semiconductor LM1871 RC Encoder/Transmitter and the Signetics NE5044 Programmable Seven-Channel RC Encoder. The manufacturers' data sheets for the NE5044 and LM1871 are hereby incorporated by reference. Both of these integrated circuits employ a pulse-width modulation scheme to encode and transmit an analog voltage or a discrete signal.

The applications notes for these transmitters primarily discuss radiofrequency (RF) transmission, however they may be adapted for the other methods of transmission as well. The selection of a transmit transducer should follow the manufacturers' recommendations on the data sheets. For optical transmissions, usually an infrared light-emitting diode (LED) is used. For radio transmission, usually a wire antenna is used. For sound transmissions, usually an ultrasonic transducer is used. For AC wiring, usually a transformer is used.

An alternative method of constructing the transmitter is to use an analog-to-digital (A/D) converter to convert the touch position into a digital signal, and then use a digital-input transmitter. Suitable A/D converters include the multiply sourced ADC0804 8-Bit A/D Converter and Signetics NE5037 6-Bit A/D Converter. The manufacturers' data sheets for the ADC0804 and NE5037 are hereby incorporated by reference.

Several integrated circuit digital-input transmitters are available, including the National Semiconductor MM58250 Infrared Transmitter, Motorola MC145026, Motorola MC14457, and Motorola MC14497. The manufacturers' data sheets for the MM58250, MC145026, MC14457, and MC14497 are hereby incorporated by reference. These transmitters may also be adapted to the previously described communications methods.

Several well-known methods for powering the circuitry of the remote controller may be used, including external wired power, replaceable battery power, rechargeable battery power, and solar cell power. Use of solar cells to power the remote controller requires low-power consumption circuitry for the touch fader reader and transmitter, however this eliminates the need for the user to periodically change a battery.

Figure 3:
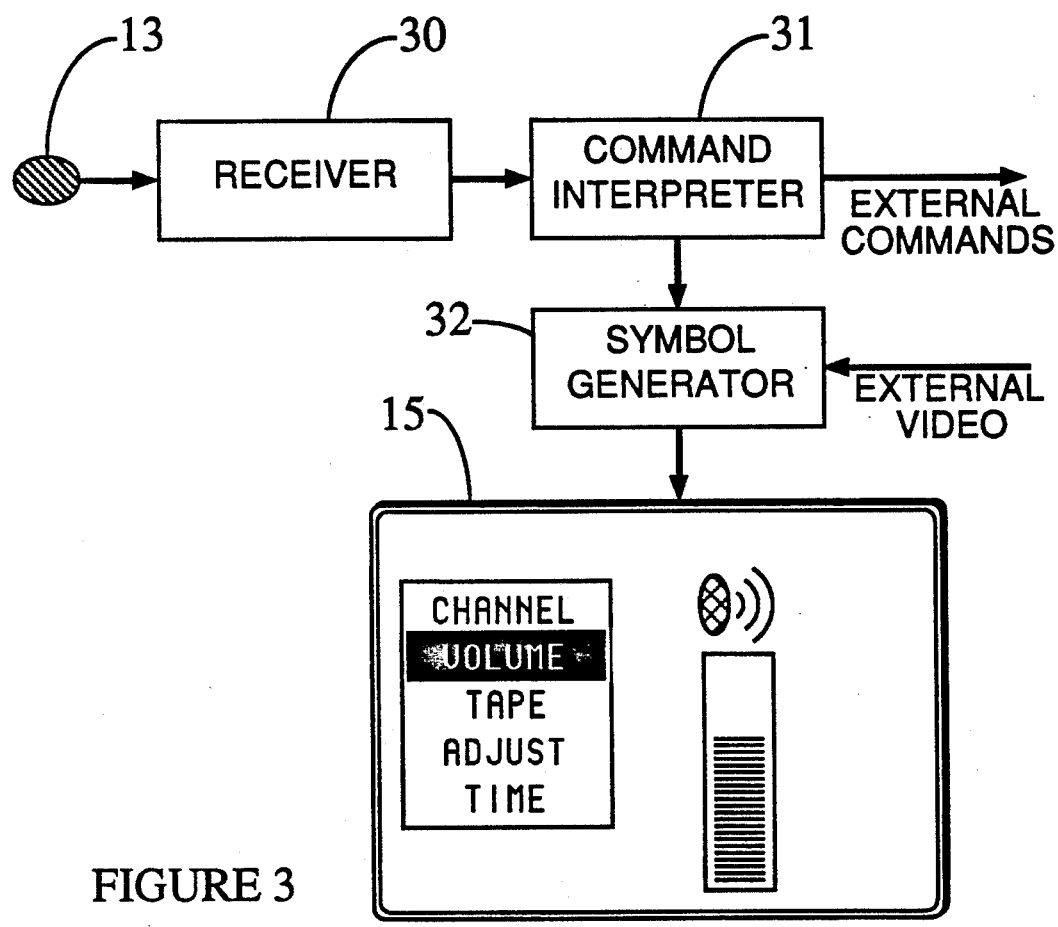
FIG. 3 shows the internal structure of the receive and display unit 16.

FIG. 3 shows the internal structure of the receive and display unit 16. The receive transducer 13 receives the transmission signal from the communications channel. The receiver 30 interfaces to the receive transducer 13 and recovers the touchpoint information. The command interpreter 31 interprets the touchpoint information as some intended command, based on previous user inputs and a predefined command structure. When appropriate, the command interpreter 31 sends external commands to the device to be controlled, and instructs the symbol generator 32 which symbols and any corresponding parameters that should appear on the visual display 15.

Selection of a receive transducer 13 and receiver 30 depend on the communications method chosen, particularly on the transmitter and transmit transducer, and should follow the manufacturers' recommendations on the data sheets for integrated circuit transmitters and receivers. For optical transmissions, usually an infrared photo-transistor is used. For radio transmission, usually a wire antenna is used. For sound transmissions, usually an ultrasonic transducer is used. For AC wiring, usually a transformer is used.

Several integrated circuit receivers are available, including the Motorola MC3373 Remote Control Amplifier-Detector, MC14458 Receiver, MC145027, MC145028, and MC145029 Decoders, National Semiconductor LM1872 Radio Control Receiver/Decoder, and Signetics NE5045 Seven-Channel RC Decoder. The manufacturers' data sheets for the MC3373, MC14458, MC145027, MC145028, MC145029, LM1872, and NE5045 are hereby incorporated by reference.

When the NE5045 or LM1872 are employed, the pulse-width outputs will typically need to be converted into a digital word that can be used by the command interpreter. This process is discussed in Signetics Application Note AN1311, "Low Cost A/D Conversion Using The NE5044", which is hereby incorporated by reference.

The command interpreter 31 is typically implemented in software that executes on a microprocessor, which may also, but not necessarily, execute portions of the symbol generator 32. Construction methods of a display system comprising a microprocessor, symbol generator, and visual display are well known. An example is described in Intel Application Note AP-62, "A Low Cost CRT Terminal Using The 8275", which is hereby incorporated by reference. In addition, an external video signal may be combined with the symbolic representations, as described in the data sheets for the Motorola MC1378 Color Television Composite Video Overlay Synchronizer, which is hereby incorporated by reference. Richards, U.S. Pat. No. 4,907,082, which is hereby incorporated by reference, describes such a video display and menu system specifically designed for a television.

The Command Interpreter

FIG. 4 shows a state transition diagram for a COMMAND INTERPRETER, although there are many ways to describe and implement the command interpreter 31. The COMMAND INTERPRETER executes perpetually, and enters into the initial state WAITING FOR TOUCH. There would typically be an initialization process (i.e. hardware self-test, variable initializations, etc.) before COMMAND INTERPRETER is entered.

User inputs and the resulting displays and device control signals are interpreted based on a predefined command structure. Table 1 presents such a command structure intended for use with a television and VCR, although many other command structures may be implemented, depending on the devices to be controlled or personal preferences.

While COMMAND INTERPRETER is not performing any action and the user in not touching the touch fader, it remains in the state WAITING FOR TOUCH. This state is exited upon the condition TOUCH PRESSED, which occurs when the user touches the touch fader.

Upon TOUCH PRESSED, the COMMAND INTERPRETER transition to DISPLAY MENU. When no user actions are pending, the displayed menu defaults to the MAIN menu. COMMAND INTERPRETER then transitions to INTERPRET MENU, which browses the displayed menu and performs an action based on the user's touch inputs and the predefined command structure.

In the case of the MAIN menu as defined in Table 1, the menu selections VOLUME, CHANNEL, TAPE, ADJUST, and TIME would be displayed for the user. Initially, one of the menu selections will be highlighted, depending on the position of the user's finger on the touch fader. For example, touching the top of the fader would highlight VOLUME.

TABLE 1

| MENU | SELECTIONS | DISPLAY | FUNCTION/MENU |
|---|---|---|---|
| MAIN | VOLUME | BARGRAPH | SET_VOLUME |
| | CHANNEL | LIST | SET_CHANNEL |
| | TAPE | MENU | TAPE |
| | ADJUST | MENU | ADJUST |
| | TIME | CLOCK | SET_TIME |
| TAPE | STOP | NONE | VCR_CONTROL |
| | PLAY | NONE | VCR_CONTROL |
| | RECORD | NONE | VCR_CONTROL |
| | REWIND | NONE | VCR_CONTROL |
| | FORWARD | NONE | VCR_CONTROL |
| | PAUSE | NONE | VCR_CONTROL |
| | TRACKING | BARGRAPH | VCR_TRACKING |
| | PROGRAM | LIST | PROGRAM |
| ADJUST | BRIGHT | BARGRAPH | SET_BRIGHT |
| | COLOR | BARGRAPH | SET_COLOR |
| | TINT | BARGRAPH | SET_TINT |
| | CHANNELS | LIST | SET_CHANNEL_NAMES |
| PROGRAM | NAME | STRING | SET_PROGRAM |
| | TIME | CLOCK | SET_PROGRAM |
| | CHANNEL | LIST | SET_PROGRAM |
| | REPEAT | LIST | SET_PROGRAM |

David J. Asher, Remote Control System, page 15

Besides the menu, four user interaction devices have been defined to facilitate user input, but other devices may be defined as well. INTERPRET MENU may transition to any of INTERPRET BARGRAPH, INTERPRET LIST, INTERPRET STRING, or INTERPRET CLOCK by terminating in one of the conditions DISPLAY IS BARGRAPH, DISPLAY IS LIST, DISPLAY IS STRING, or DISPLAY IS CLOCK, respectively. If another level of menu is required, INTERPRET MENU will terminate with the condition DISPLAY IS MENU, causing a transition back to DISPLAY MENU upon which a new menu will be displayed and interpreted.

After INTERPRET BARGRAPH, INTERPRET LIST, INTERPRET STRING, or INTERPRET CLOCK terminates, or if INTERPRET MENU terminates with either of the conditions DISPLAY IS NONE or TOUCH CANCELLED, COMMAND INTERPRETER will transition to WAITING FOR NEW TOUCH. This state provides a waiting period, during which time the menu remains displayed and the user may continue using the displayed menu by again touching the touch fader, causing the condition TOUCH PRESSED and a transition back to INTERPRET MENU. A TIMEOUT condition, meaning the user did not touch the fader during the waiting period, will cause a transition to RESTORE DISPLAY, which removes all menus from the display, and then transitions to the WAITING FOR TOUCH state. A similar TIMEOUT termination condition is provided in the INTERPRET MENU state.

FIG. 5 shows a state transition diagram for an INTERPRET MENU process, which enters into the WAITING FOR TOUCH state. INTERPRET MENU may terminate with TIMEOUT if the user does not touch the touch fader during this initial waiting period. WAITING FOR TOUCH transitions to WAITING FOR TOUCHPOINT CHANGE given the condition TOUCH PRESSED. Since the MAIN menu was entered with the user already touching the touch fader, TOUCH PRESSED is initially true and the state WAITING FOR TOUCHPOINT CHANGE is immediately entered.

There are three terminations from WAITING FOR TOUCHPOINT CHANGE: POSITION CHANGED, TOUCH RELEASED, and TOUCH CANCELLED. The POSITION CHANGED condition is caused by the user changing the touch position, and transitions to UPDATE MENU, which changes the displayed menu selection and then transitions back to WAITING FOR TOUCHPOINT CHANGE. TOUCH RELEASED is caused by the user releasing the touch fader, and transitions to PERFORM SELECTION. The TOUCH CANCELLED condition is caused by the user moving into the "cancel zone" printed onto the touch fader, and terminates INTERPRET MENU.

In some cases, PERFORM SELECTION will directly change a device parameter, such as the STOP selection in the TAPE menu, and then will terminate with the condition DISPLAY IS NONE. In other cases, PERFORM SELECTION will simply choose a proper termination condition based on the command structure, such as DISPLAY IS BARGRAPH for the COLOR selection in the ADJUST menu. In still other cases, PERFORM SELECTION will choose a new menu and terminate with DISPLAY IS MENU, such as the TAPE selection in the MAIN menu.

In effect, the user activates a menu by touching the touch fader, then browses the menu by moving his or her finger along the touch fader, highlighting the various selections according to the touch position. Finally, the user performs the highlighted selection by releasing the touch fader. At any time, the user may move into the cancel zone to remove the menu from the screen.

In some cases it is preferable to not only list the menu selections, but to indicate a status as well. For example, the TAPE menu might have the current state of the VCR (say, REWIND) marked. The PROGRAM menu, for example, might display the programmed name, time, channel, and repeat period alongside the menu selections.

FIG. 6 shows a state transition diagram for an INTERPRET BARGRAPH process. In this figure, PARAMETER refers to some actual device setting, such as volume, and is initially saved so that it can later be restored if the user cancels the bargraph input.

As an example of the operation of the bargraph, the user may have selected VOLUME on the MAIN menu. Upon releasing the touch fader, a bargraph appears on the display. It might be appropriate for the bargraph to be labelled "VOLUME", or have some graphic symbol indicating volume. It might also be appropriate to provide a numeric display that corresponds to the bargraph. The bargraph is preferably vertical on the display, but may also be horizontal.

With the bargraph displayed, if the user moves up on the touch fader, the bargraph would increase and the user would also hear the volume increase. Conversely, if the user moves down on the touch fader, the bargraph and the volume would decrease. If the user moves into the cancel zone, the original saved bargraph setting and volume would be restored. Releasing the touch fader would accept the current volume, but leave the bargraph displayed for a short period for the user to view, or perhaps to make another change. If the user does not touch the touch fader at all, the bargraph would be displayed for a short period, no change will be made in the volume, and the bargraph will time out and disappear.

The relationship between touch position and bargraph position could be relative or absolute. In an absolute mode, the position along the touch fader directly corresponds to a bargraph setting, so that touching the top of the touch fader results in a maximum bargraph setting, and touching the bottom produces a minimum bargraph setting. In a relative mode, only the change in touch position translates into a change in bargraph setting, so the initial touch has no effect on the parameter, and the user would be able to release the touch fader and touch it again to repeatedly change the bargraph setting. A timeout period allows the user to release and retouch the touch fader without immediately accepting the current setting. The relative mode might have a nonlinear relationship in position change, so that moving faster produces a greater change.

FIG. 7 shows a state transition diagram for an INTERPRET LIST process, which allows the user to scroll through a set of list members, each described by a character string. For example, the CHANNEL list could be presented as a continuous list of channel numbers, say 2 through 99. It may also be presented as a noncontinuous list of the channel numbers actually available for that user (2, 4, 5, and 12, for example). It may also be presented as a list of network or television station identifications (ABC, NBC, CBS, CNN, for example).

The list may be represented on the display similarly to a menu, with as many list members appearing as can be fit on the display, and with the selected list member highlighted. It may also be represented as three items: the selected list member and the previous and successive member. It may also be represented as only the selected list member. It will sometimes be helpful to label the list, "CHANNEL", for example.

The list may be manipulated by the user in similar ways as the bargraph: absolute or relative positioning, and may be cancelled by touching the cancel zone. Moving the touchpoint will scroll the displayed list and highlight the selected list member. Releasing the touch fader will accept the current selection.

SELECT LIST MEMBER will change the selected list member as well as perform a continuous change function, such as sending a command to the device. This will enable the user, for example, to scroll through the various available channels, and release the touch fader when the desired channel appears. PERFORM LIST FUNCTION may perform a function at the end of the list, such as an INTERPRET MENU process, using the final list selection. For example, selecting PROGRAM in the TAPE menu will present the user with a list of programs. Selecting one such program will present the user with a menu to change the parameters of that program, such as the time it should be recorded.

FIG. 8 shows a state transition diagram for an INTERPRET STRING process, which allows the user to input a text string. This could be useful for naming or defining the members of a list, such as channel identifications, or for naming a program that is set to be recorded on the VCR.

When a string input is expected, a string entry field is presented to the user. It may have a default string initially, or blanks. Touching the touch fader and moving the touchpoint will scroll through the standard text and numerical characters, i.e. it will change the value on the display of the first character. Releasing the touch fader will accept the character that is displayed and move to the next character position.

Upon releasing the touch fader, ADVANCE CURSOR will determine if the string input is complete. Several methods are possible. The string length could be set to a fixed size, for example 3 characters for a TV station identification, so that a touch release after the third character accepts the string. Alternatively, the string input termination could be detected with a special character that, when selected by the user, indicates both to the user and to ADVANCE CURSOR that the string input should be accepted. Also, ADVANCE CURSOR could provide a timeout period after the touch release so that the string will be automatically accepted after the timeout.

FIG. 9 shows a state transition diagram for an INTERPRET CLOCK process, which allows the user to view and change a time. For example, the user could select TIME on the MAIN menu, which displays the current time, perhaps in an hours, minutes, seconds (12:00:00) format, or may also include a day/date function (12/31/99). If the user does not touch the touch fader, the time will remain on the display for a short viewing period and then be removed.

Touching the touch fader will enable the user to "wind" the clock by moving the touchpoint. In this case, a relative position mode is preferred, and a nonlinear change relationship is especially helpful since the range of values is so large. Again, the user can return to the previously set time by moving to the cancel zone on the touch fader.

The present invention discloses a remote control system that provides an intuitive user interface, substantial compatibility with previous remote control systems, a universal remote controller that can be used to control many devices with the control features being determined in software. There are many ways to implement the remote control system, and it may be configured to control many devices. Accordingly, the embodiments described herein should not be taken as a limitation on the scope of the present invention, but rather should only be interpreted in accordance with the following claims.

What is claimed:

1. A touch sensitive user interface for control of a television, having touch fader input for selecting and setting a plurality of operational parameters of said television, comprising:
   (a) a touch fader for sensing the presence and position of a fingertip upon said touch fader, having a touchpoint output representing said fingertip presence and position, said touchpoint output having a plurality of touchpoint position states for indicating the linear position of said fingertip along said touch fader, and having a touchpoint invalid state for indicating the release of said fingertip from said touch fader;
   (b) a transmitter electrically connected to said touch fader, having means to encode said touchpoint output into a transmit touchpoint signal, and incorporating a transmit transducer for transmitting said transmit touchpoint signal across a communication channel;
   (c) a receiver located remotely from said transmitter, incorporating a receive transducer for receiving said transmit touchpoint signal from said communication channel, and having means to decode said transmit touchpoint signal into a received touchpoint signal; and
   (d) a data processor electrically connected to said receiver and to said television, having means to interpret said received touchpoint signal as a command for selecting one of said operational parameters, comprising the steps of: (i) displaying a set of operational parameters on said television; (ii) changing the appearance of said set of displayed operational parameters in relationship to said touchpoint position states to indicate one of said set of operational parameters to be selected; and (iii) selecting one of said set of displayed operational parameters when said touchpoint output enters said state of touchpoint invalid, and further having means to interpret said received touchpoint signal as a value for setting said selected operational parameter, comprising the steps of: (i) displaying a range of values for said selected operational parameter on said television; (ii) changing the appearance of said displayed range of values in relationship to said touchpoint position states to indicate the value of said selected operational parameter to be set; and (iii) setting the value of said selected operational parameter when said touchpoint output enters said state of touchpoint invalid.

2. A touch sensitive user interface for control of a remote system, having touch fader input for selecting and setting a plurality of operational parameters of said remote system, comprising:
   (a) a touch fader for sensing the presence and position of a fingertip upon said touch fader, having a touchpoint output representing said fingertip presence and position, said touchpoint output having a plurality of touchpoint position states for indicating the linear position of said fingertip along said touch fader, and having a touchpoint invalid state for indicating the release of said fingertip from said touch fader;
   (b) a transmitter electrically connected to said touch fader, having means to encode said touchpoint output into a transmit touchpoint signal, and incorporating a transmit transducer for transmitting said transmit touchpoint signal across a communication channel;
   (c) a receiver located remotely from said transmitter, incorporating a receive transducer for receiving said transmit touchpoint signal from said communication channel, and having means to decode said transmit touchpoint signal into a received touchpoint signal;
   (d) a visual display; and
   (e) a data processor connected to said receiver, to said visual display, and to said remote system, having means to interpret said received touchpoint signal as a command for selecting one of said operational parameters, comprising the steps of: (i) displaying a set of operational parameters on said visual display; (ii) changing the appearance of said set of displayed operational parameters in relationship to said touchpoint position states to indicate one of said set of operational parameters to be selected; and (iii) selecting one of said set of displayed operational parameters when said touchpoint output enters said state of touchpoint invalid, and further having means to interpret said received touchpoint signal as a value for setting said selected operational parameter, comprising the steps of: (i) displaying a range of values for said selected operational parameter on said visual display; (ii) changing the appearance of said displayed range of values in relationship to said touchpoint position states to indicate the value of said selected operational parameter to be set; and (iii) setting the value of said selected operational parameter of said remote system when said touchpoint output enters said state of touchpoint invalid.

* * * * *